United States Patent
Kang et al.

(10) Patent No.: US 8,440,996 B2
(45) Date of Patent: *May 14, 2013

(54) NITRIDE SEMICONDUCTOR LIGHT EMITTING DEVICE AND FABRICATION METHOD THEREOF

(75) Inventors: Sang Won Kang, Gyeonggi-do (KR);
Yong Chun Kim, Gyeonggi-do (KR);
Dong Hyun Cho, Gyeonggi-do (KR);
Jeong Tak Oh, Gyeonggi-do (KR);
Dong Joon Kim, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/358,034

(22) Filed: Jan. 25, 2012

(65) Prior Publication Data

US 2012/0119187 A1     May 17, 2012

Related U.S. Application Data

(62) Division of application No. 12/171,570, filed on Jul. 11, 2008, now Pat. No. 8,129,711.

(30) Foreign Application Priority Data

Jul. 12, 2007    (KR) ........................ 10-2007-0070107

(51) Int. Cl.
*H01L 29/06*     (2006.01)
(52) U.S. Cl.
USPC .......... 257/17; 257/13; 257/96; 257/E33.005; 438/47

(58) Field of Classification Search .................... 257/13, 257/17, 96, E33.005; 438/47
See application file for complete search history.

(56) References Cited

U.S. PATENT DOCUMENTS

| | | | |
|---|---|---|---|
| 6,252,894 B1 | 6/2001 | Sasanuma et al. | |
| 6,593,597 B2 | 7/2003 | Sheu | |
| 6,677,619 B1 | 1/2004 | Senoh et al. | |
| 6,693,303 B2 | 2/2004 | Ota et al. | |
| 8,129,711 B2 * | 3/2012 | Kang et al. ..................... | 257/17 |
| 2005/0179130 A1 | 8/2005 | Tanaka et al. | |
| 2006/0076574 A1 | 4/2006 | Wu et al. | |
| 2006/0225644 A1 | 10/2006 | Lee et al. | |
| 2006/0246612 A1 | 11/2006 | Emerson et al. | |

FOREIGN PATENT DOCUMENTS

| | | |
|---|---|---|
| JP | 11-330554 | 11/1999 |
| JP | 2000-232237 | 8/2000 |

OTHER PUBLICATIONS

Korean Office Action, w/ English translation thereof, issued in Korean Patent Application No. KR 10-2007-0070107 dated Apr. 29, 2011.

*Primary Examiner* — John C Ingham
(74) *Attorney, Agent, or Firm* — McDermott Will & Emery LLP

(57) ABSTRACT

The present invention relates to a GaN based nitride based light emitting device improved in Electrostatic Discharge (ESD) tolerance (withstanding property) and a method for fabricating the same including a substrate and a V-shaped distortion structure made of an n-type nitride semiconductor layer, an active layer and a p-type nitride semiconductor layer on the substrate and formed with reference to the n-type nitride semiconductor layer.

14 Claims, 5 Drawing Sheets

FOREIGN PATENT DOCUMENTS

| | | |
|---|---|---|
| JP | 2000-244072 | 9/2000 |
| JP | 2006-237254 | 9/2006 |
| JP | 2006-295162 A | 10/2006 |
| KR | 10-2006-0089480 | 8/2006 |

\* cited by examiner

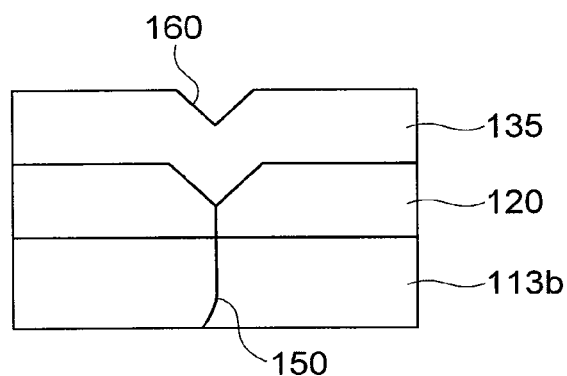
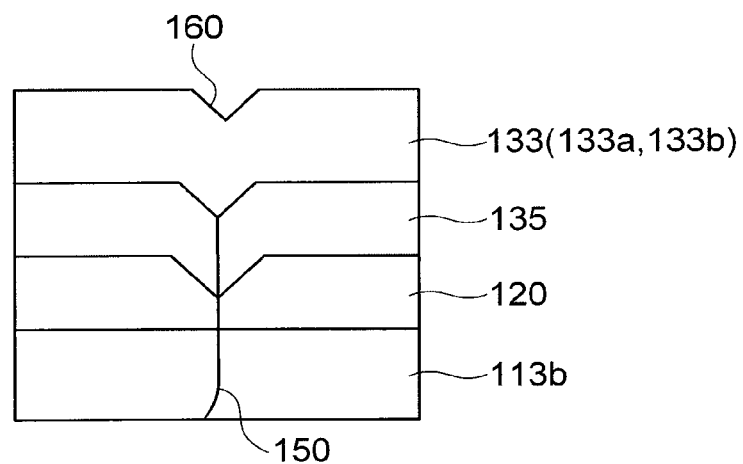

NITRIDE SEMICONDUCTOR LIGHT EMITTING DEVICE AND FABRICATION METHOD THEREOF

CROSS-REFERENCE TO RELATED APPLICATIONS

This application is a Divisional of U.S. application Ser. No. 12/171,570, filed on Jul. 11, 2008 now U.S. Pat. No. 8,129,711, which claims the benefit of Korean Patent Application No. 10-2007-0070107 filed with the Korea Intellectual Property Office on Jul. 12, 2007, the disclosures of which are incorporated herein by reference.

BACKGROUND OF THE INVENTION

1. Field of the Invention

The present invention relates to a nitride semiconductor light emitting device; and, more particularly, to a nitride semiconductor light emitting device capable of improving an ESD (Electrostatic Discharge) tolerance (withstand voltage characteristic) of a GaN based nitride light emitting device and a method for manufacturing the same.

2. Description of the Related Art

Generally, it has been known that a GaN based light emitting device has a bad static electricity characteristic in comparison with other compound light emitting devices. This reason is that a lot of crystal defects are formed in a GaN thin film due to a great lattice mismatch (16%) between a substrate and a thin film to be grown since the GaN light emitting device is formed on a sapphire substrate having a great lattice mismatch.

This crystal defect increases a leakage current of device and an active layer of the light emitting device having a lot of crystal defects is broken by a strong field when an external static electricity is applied. Generally, it has been known that the crystal defect (threading dislocations) in the order of $10^{10} \sim 10^{12}/cm^2$ exist at the GaN thin film.

The static electricity broken characteristic of the light emitting device is a very important issue related to the application range of the GaN based light emitting device. Specifically, a design of devices for withstanding a static electricity generated from package devices and workers of the light emitting device is a very important parameter for improving yield of a final device.

Particularly, the static electricity characteristic has been become more important since the GaN based light emitting device are recently used by being applied to a bad condition in environment such as an outdoor signboard and a vehicle light.

Generally, an ESD (Electrostatic Discharge) of a conventional GaN light emitting device withstands several thousands volts in a forward direction under HBM (Human Body Mode), whereas it does not withstand several hundreds volts in a reverse direction. The reason is that the crystal defects of the device are major reasons as described above, and also, an electrode design of the device is very important. Particularly, since the GaN light emitting device generally employs a sapphire substrate as an insulator, the ESD characteristic is further deteriorated by increasing a concentration phenomenon of currents around an N-electrode during a practical device operation as the N-electrode and a P-electrode are formed at the same plane on the structure of the device.

A conventional method for improving such ESD characteristic has been frequently approached in external aspects of the device. U.S. Pat. No. 6,593,597 teaches a technique for protecting a light emitting device from the ESD by connecting an LED and a Schottky diode in parallel by integrating the LED device and the Schottky diode on the same substrate. In addition, in order to improve the ESD tolerance, a method for connecting an LED to a Zenor diode in parallel has been proposed. However, since such methods cause complicatedness to be assembled by purchasing an additional Zenor diode or performing a Schottky junction and increase the manufacturing cost of the device, they are not preferable in point of cost or yield.

The most preferable method is that the ESD characteristic is improved by the light emitting device in itself by improving a thin film characteristic or a structure of the light emitting device. Japanese Pat. No. 3,622,562 discloses a method for improving an ESD characteristic by using a multi-stacked thin film structure using un-doped nitride indium gallium and un-doped nitride gallium on an n-type contact layer, whereas Japanese Pat. No. 3,063,756, Japanese Pat. No. 3,424,629, Japanese Pat. No. 2006-237254 and U.S. Pat. No. 6,677,619 try to reduce leakage currents and improve ESD tolerance by making a layer structure a good crystal property by reducing the density and size of defects to be generated from each layer of the light emitting device.

As like this, it is preferable that the quality of a GaN thin film is intrinsically increased to improve the ESD characteristic, but there exists a limitation to remove the defects, therefore, a method of growing the thin film has been continuously continued to improve the ESD characteristic of the GaN up to date.

SUMMARY OF THE INVENTION

The present invention has been invented in order to overcome the above-described problems and it is, therefore, an object of the present invention to provide a nitride semiconductor light emitting device and a fabrication method thereof capable of improving an ESD effect by changing factor to reduce leakage currents inversely using crystal defects (threading dislocations) which were the reasons for conventional leakage currents.

The object of the present invention can be achieved by providing a nitride semiconductor light emitting device including a substrate; a light emitting structure made of an n-type nitride semiconductor layer, an active layer and a p-type nitride semiconductor layer formed sequentially on the substrate and having threading dislocations penetrating the n-type nitride semiconductor layer, the active layer and the p-type nitride semiconductor layer, and a V-shaped distortion layer formed with reference to the threading dislocations.

And, the substrate is capable of being selected from any one of sapphire, spinel (MgA1204), SiC, Si, ZnO, GaAs, GaN substrates.

And, the nitride semiconductor light emitting device further includes a buffer layer between the substrate and the n-type semiconductor layer and it is preferable that the buffer layer is selected from any one of a nitride based semiconductor and a carbide based semiconductor.

The n-type nitride semiconductor layer is constructed by including an n-type GaN based semiconductor layer and an n-type super lattice layer.

At this time, the super lattice layer can be constructed with an AlGaN/GaN/InGaN based multi-stacked structure and be constructed by further including an n-type electrode on the n-type GaN based semiconductor.

And, it is preferable that the V-shaped distortion layer is formed on a surface of the n-type nitride GaN based semiconductor layer.

The active layer has at least one quantum well structure and the quantum well structure can be constructed with InGaN/GaN.

The p-type nitride semiconductor layer is constructed by including a p-type super lattice layer and the p-type GaN based semiconductor layer and the p-type super lattice layer can be constructed with an AlGaN/GaN/InGaN based multi-stacked structure.

And, a transparent electrode and a bonding electrode are further included on the p-type nitride semiconductor layer.

In the V-shaped distortion structure, it is preferable that a flat growth surface, i.e., (0001) surface equal to a substrate surface and a sloped growth surface, i.e., (1−101) surface, (11−22) surface or the other sloped crystal surfaces, inclined with respect to the substrate surface exist together. The flat growth surface means that a surface is parallel to the substrate surface, and the sloped growth surface means a slope of any one surface the crystal surface grown on the flat surface is inclined from 0° to 90° with reference to the substrate surface.

And also, the present invention includes a substrate, an n-type semiconductor layer formed on the substrate, an active layer formed on the n-type semiconductor layer, a p-type semiconductor layer formed on the active layer, a transparent electrode formed on the p-type semiconductor layer, an n-type electrode formed on an exposed portion of the n-type semiconductor layer and a bonding electrode formed on the transparent electrode, wherein threading dislocations penetrating the n-type semiconductor layer, the active layer and the p-type semiconductor layer are formed and an V-shaped distortion structure is formed with reference to the threading dislocations.

The V-shaped distortion structure is formed from the n-type semiconductor layer and includes a flat surface together with a sloped surface and the V-shaped distortion structure becomes smooth in shape, i.e., a valley shape or a distortion shape, as approaching the active layer and the p-type semiconductor layer.

A buffer layer can be further included between the substrate and the n-type semiconductor layer.

And also, an n-type super lattice layer is further included between the n-type semiconductor layer and the n-type super lattice layer, wherein the super lattice layer is formed with a repeated structure of at least three layers, each of the layers is made of $Al_xIn_yGa_zN$ ($0 \leq x, y, z \leq 1$) with a different composition.

The active layer has at least one quantum well structure made of $Al_xIn_yGa_zN$ ($0 \leq x, y, z \leq 1$).

The nitride semiconductor light emitting device is constructed by further including the p-type super lattice between the active layer and the p-type semiconductor layer, and it is preferable that the p-type super lattice layer has a a repeated structure of at least three layers, each of the layers is made of $Al_xIn_yGa_zN$ ($0 \leq x, y, z \leq 1$) with a different composition.

And also, the present invention, in a nitride semiconductor light emitting device including a light emitting structure made of an n-type nitride semiconductor layer, an active layer and a p-type nitride semiconductor layer, forms the treading dislocations penetrating the light emitting structure and having the V-shaped distortion structures around the threading dislocations.

The V-shaped distortion structure includes a flat growth surface together with a sloped growth surface.

The n-type nitride semiconductor layer includes an un-doped GaN layer, an n-type GaN contact layer and an n-type super lattice on the n-type GaN contact layer.

The p-type nitride semiconductor layer includes a p-type super lattice layer or a multi-stacked layer and a p-type GaN contact layer on the n-type GaN layer.

And, the present invention is constructed by further including an n-type electrode formed on the n-type GaN contact layer and a p-type electrode formed on the p-type GaN contact layer.

The V-shaped distortion structure can be formed on at least one among the n-type semiconductor layer, an active layer and a p-type semiconductor layer.

And also, the present invention provides a method for forming a nitride semiconductor light emitting device includes the steps of: preparing a substrate; forming an n-type semiconductor layer with a V-shaped distortion structure on the substrate; forming an active layer on the n-type semiconductor layer; and forming a p-type semiconductor layer on the active layer.

The step of forming the buffer layer can be performed any one among a nitride based semiconductor or a carbide based material, wherein if the nitride semiconductor based buffer layer is formed, it is formed at a range from 200° C. to 900° C., whereas if the carbide based buffer layer is formed, it is formed at a range from 500° C. to 1500° C.

The step of forming the n-type GaN layer having the V-shaped distortion structure is performed at a temperature ranging from 700° C. to 950° C.

Or, it is possible that the step of forming the n-type GaN layer having the V-shaped distortion structure is performed by forming the n-type GaN layer and forming V-shaped defects through a chemical etching on a surface of the n-type GaN layer.

The step of forming the n-type super lattice layer on the n-type GaN layer is performed by forming a repeated structure of at least three layers, each of the layers is made of $Al_xIn_yGa_zN$ ($0 \leq x, y, z \leq 1$) with a different composition.

The step of forming the active layer is performed by including a step of forming at least one quantum well structure by alternately stacking $Al_xIn_yGa_zN/Al_xIn_yGa_zN$ ($0 \leq x, y, z \leq 1$) with a different composition.

The step of forming the p-type semiconductor layer is performed by including the steps of: forming a p-type super lattice layer; forming a $p^+$-type GaN layer on the p-type GaN layer.

The step of forming the p-type super lattice layer includes a step of forming a repeated structure of at least three layers, each of the layers is made of $Al_xIn_yGa_zN$ ($0 \leq x, y, z \leq 1$) with a different composition.

The present invention can be performed by further including the steps of: forming the transparent electrode on the p-type semiconductor layer; exposing the n-type semiconductor layer; and forming a p-type electrode and an n-type electrode on the p-type semiconductor layer and the exposed n-type semiconductor layer.

The nitride semiconductor light emitting device of the presented invention constructed as described above prevents the leakage currents due to the threading dislocations by forming the V-shaped distortion structure around the threading dislocation generated due to a lattice mismatching to increase the resistance of the region of the V-shaped distortion structure, thereby improving the ESD effect.

That is, the threading dislocations due to the lattice mismatching between a sapphire substrate and a GaN semiconductor formed thereon are generated, when a static electricity is applied, the threading dislocations become the cause of leakage currents by concentrating the currents. Therefore, various researches has been progressed to reduce the damages due to the ESD by reducing the threading voltage becomes the cause of a conventional leakage current.

However, the present invention reduces the leakage current and prevents the damage of the light emitting device due to ESD by inversely using the threading distortions. That is, the present invention prevents the currents concentrated on the region where the threading dislocations exist by arbitrarily forming the V-shaped distortion structure around the threading dislocations and increasing the resistance in the region. At this time, the V-shaped distortion structure can be formed through a growth temperature or a chemical etching.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 2A~2C are cross sectional views representing a V-shaped distortion structure in accordance with the present invention;

DETAILED DESCRIPTION OF THE PREFERRED EMBODIMENTS

Hereinafter, an apparatus for forming a nitride semiconductor light emitting device and a method for forming a fabrication method thereof in accordance with the present invention will be described in detail with reference to the accompanying drawings.

Figure 1:
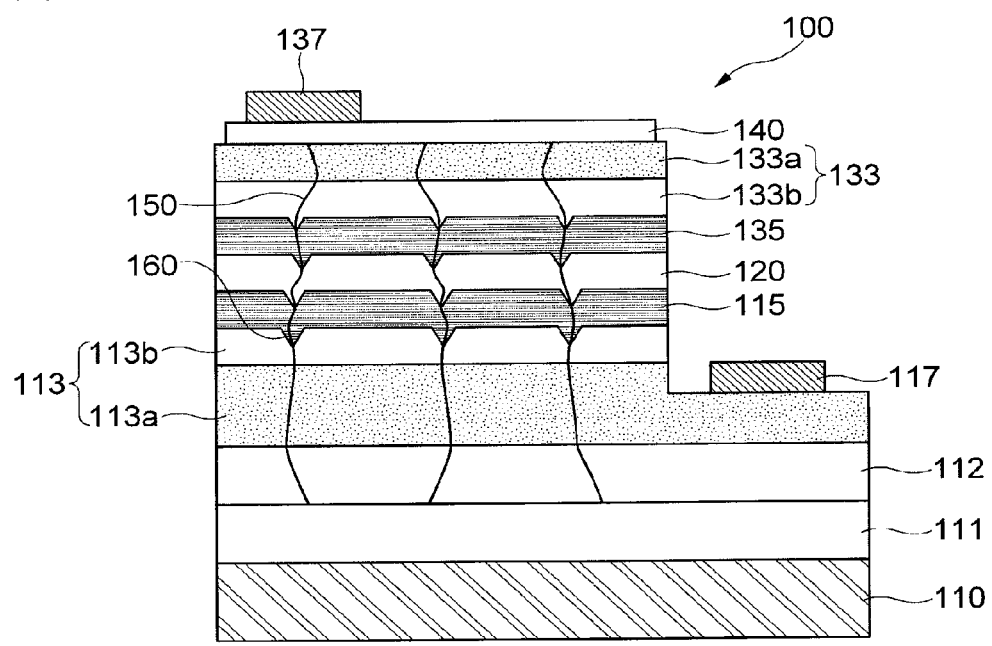
FIG. 1 is a cross sectional view showing a structure of a nitride semiconductor light emitting device (LED) in accordance with the present invention.

FIG. 1 is a cross sectional view showing a structure of a nitride semiconductor light emitting device (LED) in accordance with the present invention.

As shown in FIG. 1, a nitride semiconductor light emitting device 100 in accordance with the present invention includes a substrate 110, a buffer layer 111 formed on the substrate 100, a light emitting structure made of n-type nitride semiconductor layers 113 and 115, an active layer 120 and p-type nitride semiconductor layers 135 and 133 sequentially stacked on the buffer layer 111, and a V-shaped distortion structure layer 160 formed with reference to a penetration defect penetrating into at least one portion of the light emitting structure. At this time, an un-doped GaN layer 112 which does not perform a doping is further included between the buffer layer 111 and the n-type nitride semiconductor layer 113.

A portion of top surface of the n-type nitride semiconductor layer 113 is exposed by mesa etching the p-type nitride semiconductor layers 133 and 135 and the active layer 120, and an n-type electrode 117 is formed on the exposed n-type nitride semiconductor layer 113.

And, a transparent electrode 140 made of a material such as ITO (Indium-Tin Oxide) is formed on the p-type nitride semiconductor layer 133 and a bonding electrode 137 is formed on the transparent electrode 140.

It is preferable that the substrate 110 is formed by using a transparent material including sapphire as a substrate suitable for growing a nitride semiconductor single crystal and the substrate can be formed by using a material such as zinc oxide (ZnO), gallium nitride (GaN), gallium arsenide (GaAs), silicon, silicon carbide (SiC), aluminum nitride (AlN) or the like in place of the sapphire.

The buffer layer 111 can be formed by using at least one material among generally un-doped GaN, InGaN, AlN, InN, AlInGaN, SiC, ZnO as a layer for improving a lattice matching with the substrate 110 formed by including the sapphire before growing the n-type nitride semiconductor layer 113 on the substrate 110.

The n-type nitride semiconductor layer 113 is constructed with an n-type GaN contact layer 113a doped with n-type impurities such as Si, Ge, Sn or the like, an n-type GaN layer 113b having the V-shaped distortion structure 160 on the n-type GaN contact layer 113a and an n-type super lattice layer 115.

The n-type super lattice layer 115 has a structure repeatedly stacked with at least three layers made of $Al_xIn_yGa_zN$ ($0 \leq x, y, z \leq 1$), and it is preferable that the n-type super lattice layer 115 has a repeated structure of three layer made of a AlGaN layer, a GaN layer and an InGaN layer, wherein at least one layer of the AlGaN layer, the GaN layer and the InGaN layer has a thickness below 20 nm.

And also, the n-type GaN layer 113b or the n-type super lattice layer 115 can be formed with a multi-stacked layer obtained by changing the concentration of n-type impurities, the thickness of each layer or the ingredient of each layer. For example, various layers are obtained by changing the doping concentration of the GaN ingredient or the n-type multi-stacked layer can be formed by stacking at least two layers having different ingredient of GaN, InGaN and AlGaN, repeating layers having different impurity concentration or repeating layers having thickness alternately.

Meanwhile, the V-shaped distortion structure layer 160 prevents current from being concentrated on a threading dislocation 150 by being formed around the penetration potential 150 which penetrates the light emitting structure.

Figure 2A:
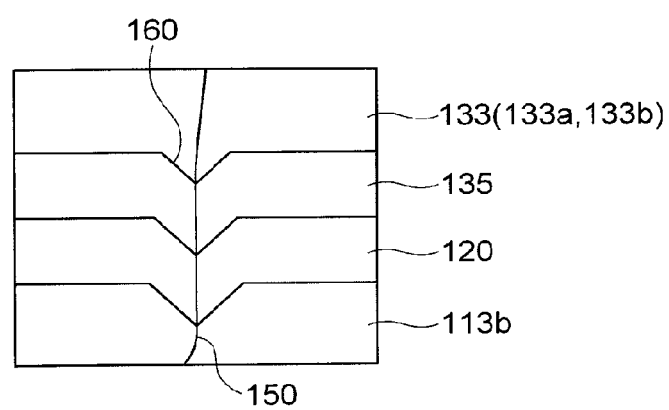
Figure 3:
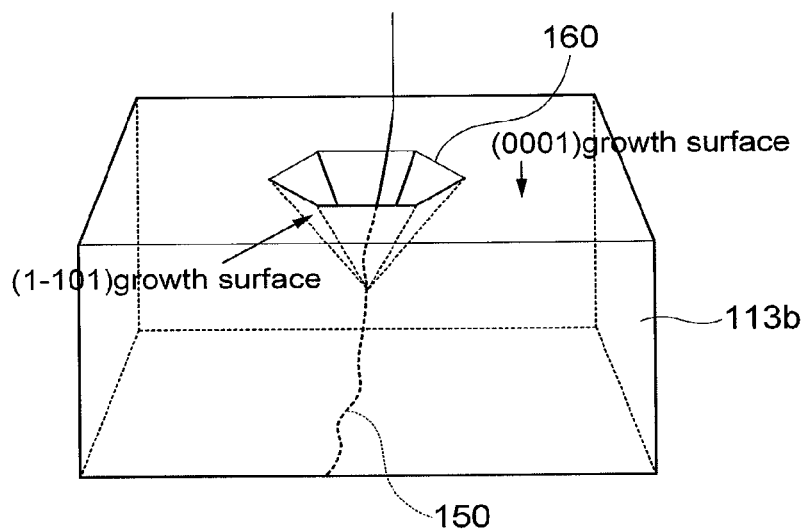
FIG. 3 is a perspective view depicting a defect of the V-shape formed on a surface of an n-type GaN layer.

FIG. 2 and FIG. 3 are views showing the V-shaped distortion structure 160, wherein FIG. 2 is a cross sectional view and FIG. 3 is a perspective view.

As shown in the drawings, the V-shaped distortion structure 160 represents a surface shape including a normal growth surface (0001) together with a sloped growth surface (1−101) and the sloped growth surface (1−101) is a regular hexahedron in top view and a V-shape in cross sectional view.

And, as described above, a position where the V-shaped distortion structure 160 is formed is selectively generated at a place where the threading dislocation 150 is formed, and the threading dislocation 150 can be finished in the middle of the V-shaped distortion structure 160 (referring to FIG. 2B and FIG. 2C).

The V-shaped distortion structure 160 becomes smooth in a valley shape of the V-shape as approaching a thickness direction of each layer, i.e., the active layer 120 and the p-type nitride semiconductor layer 133 in the n-type GaN layer 113b, and forms a uniform layer structure by gradually making the valley of the V-shape flat around the p-type GaN contact layer 133a after passing the p-type GaN layer 133b (referring to FIG. 2).

At this time, while the n-type super lattice layer 115 and the active layer 120 are formed, the reason for maintaining the V-shape is that the growth temperature is below 900° C., and the reason for filling the V-shape is that the growth temperature is above 1000° C. when the p-type GaN layer 133b.

As described above, the present invention controls the V-shaped distortion structure 160 by controlling the growth temperature of the semiconductor layer and a method for fabricating the nitride semiconductor light emitting device in accordance with the present invention will be described in detail hereinafter.

As described above, the p-type nitride semiconductor layer 133 formed in the state of existing the sloped growth surface has an effect to prevent current since a p-type GaN layer having a semi-insulator characteristic with low conductivity at a portion where the V-shaped distortion structure 160.

As like this, the characteristic of preventing the current at the portion where the V-shaped distortion structure 160 exists drastically improves the ESD tolerance of devices by preventing the current concentrated through the defect, i.e., the threading dislocation, when static electricity is applied. Particularly, in the present invention, an ESD tolerance value becomes larger than 6 kV with reference to a reverse direction.

A survival rate (the number of good products after applying ESD/the number of good products before applying the ESD× 100) at a specific voltage is more important than an absolute tolerance value in the evaluation for the ESD tolerance, and the ESD survival rate in a conventional structure is remarkably improved from 60% to 95% with reference to the survival rate in 2 kV of reverse direction by applying the structure proposed in the present invention.

In general, in the light emitting device with longitudinal and vertical sizes above several hundreds micrometers, the number of V-shaped distortion shapes is larger than one and equal to or less than the distribution of the threading dislocations 150. For example, if the number of dislocations is $5\times10^8/cm^2$, the number of V-shaped distortions below $5\times10^8/cm^2$; the most ideal case is that the dislocations and the V-shaped distortions have the same distribution and number by forming the V-shaped distortion at all dislocations; and therefore, in the structure in accordance with the present invention, the V-shaped distortions are formed in the almost dislocations.

Sequentially, the construction of the nitride semiconductor light in accordance with the present invention will be described with reference to FIG. 1, and the active layer 120 formed on the n-type super lattice layer 115 can be constructed with a multi-quantum well structure made of $Al_xIn_yGa_zN$ ($0 \leq x, y, z \leq 1$) for example, with a multi-quantum well structure having a structure alternately stacked with an InGaN based quantum well layer and a GaN based quantum barrier layer.

At this time, the active layer 120 can control a wavelength or quantum efficiency by controlling the height of the quantum barrier layer, the thickness of the quantum well layer, the ingredient and the number of the quantum wells.

On the other hands, the active layer 120 can be constructed with one quantum well layer or a double-hetero structure.

The p-type nitride semiconductor layer 133 is made of the p-type super lattice layer 135, the p-type (Al)GaN layer 133b and the p-type (In)GaN contact layer 133a as a semiconductor layer doped with p-type impurities such as Mg, Zn, Be or the like.

The p-type super lattice layer 135 has a structure stacked by repeating at least three layers made of $Al_xIn_yGa_zN$ ($0 \leq x, y, z \leq 1$), i.e., a representative example is a repeated structure of three layers made of an AlGaN layer, a GaN layer and an InGaN layer, wherein at least one layer has a thickness below 20 nm.

And also, the p-type (Al)GaN layer or the p-type super lattice layer can be formed as a multi-stacked layer obtained by changing the concentration of p-type impurities or the thickness of each layer or ingredient of each layer. For example, various layers can be made by changing the doping concentration of the GaN ingredient or the p-type multi-stacked layer can be formed by stacking at least two layers having different ingredients of GaN, InGaN and AlGaN, repeating layers having different impurity concentrations or repeating layers having different thicknesses. The p-type multi-stacked layer can be positioned between the p-type contact layer and the active layer 120.

More specifically, since the thickness of the p-type GaN layer 133b has an effect on a forward direction ESD characteristic, the present invention can achieve a high tolerance value above 6 kV of the forward direction ESD value by making the thickness of the p-type GaN based material layer (the p-type super lattice layer, the p-type GaN layer, the p-type GaN contact layer) on the active layer 120 larger than 250 nm.

The nitride semiconductor light emitting device 100 of the present invention constructed as described above improves the ESD tolerance by blocking the currents concentrated through the defect, i.e., the threading dislocation, when the static electricity is applied, by forming the V-shaped distortion around the threading dislocation penetrating the light emitting structure for increasing the resistance in the region of the V-shaped distortion. That is, since the threading dislocation becomes a reason for the leakage current, it causes the damages of devices due to the concentration of currents during the apply of the static electricity; however, the present invention improves the ESD level above 6 kV with reference to the inverse direction by increasing the resistance around the threading dislocation through the V-shaped structure inversely using the threading dislocation.

Hereinafter, a method for fabricating the nitride semiconductor light emitting device in accordance with the present invention constructed as described above will be explained with reference to the drawings.

Figure 4A:
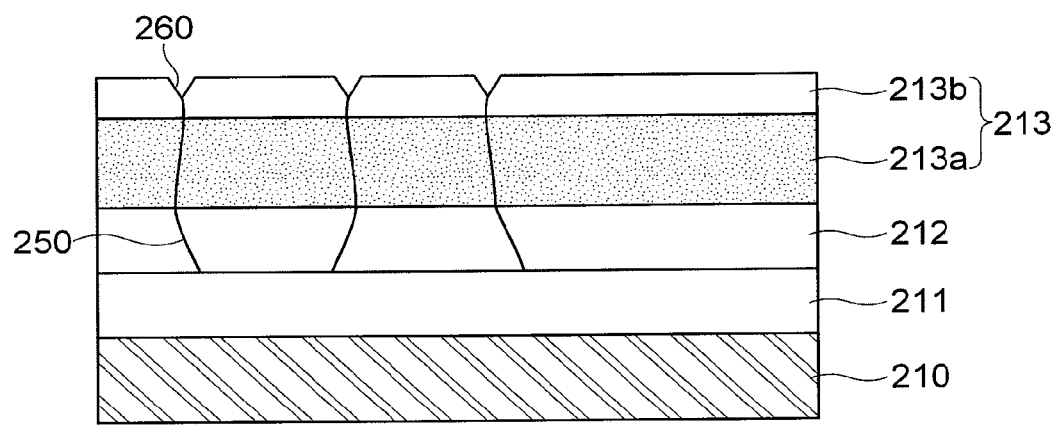
FIGS. 4A-4C are cross sectional views illustrating a method for manufacturing a nitride semiconductor light emitting device in accordance with the present invention.
Figure 4B:
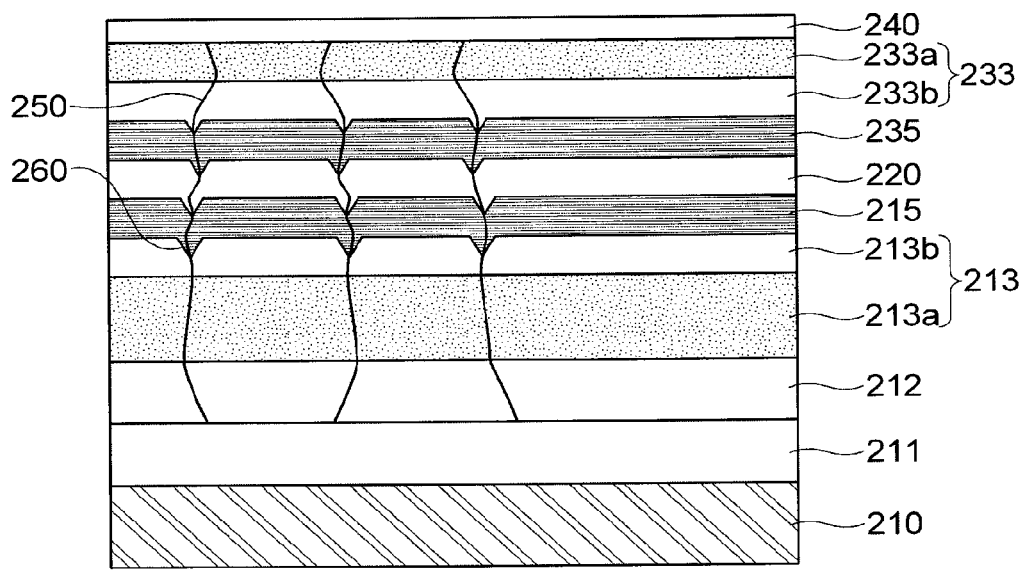
Figure 4C:
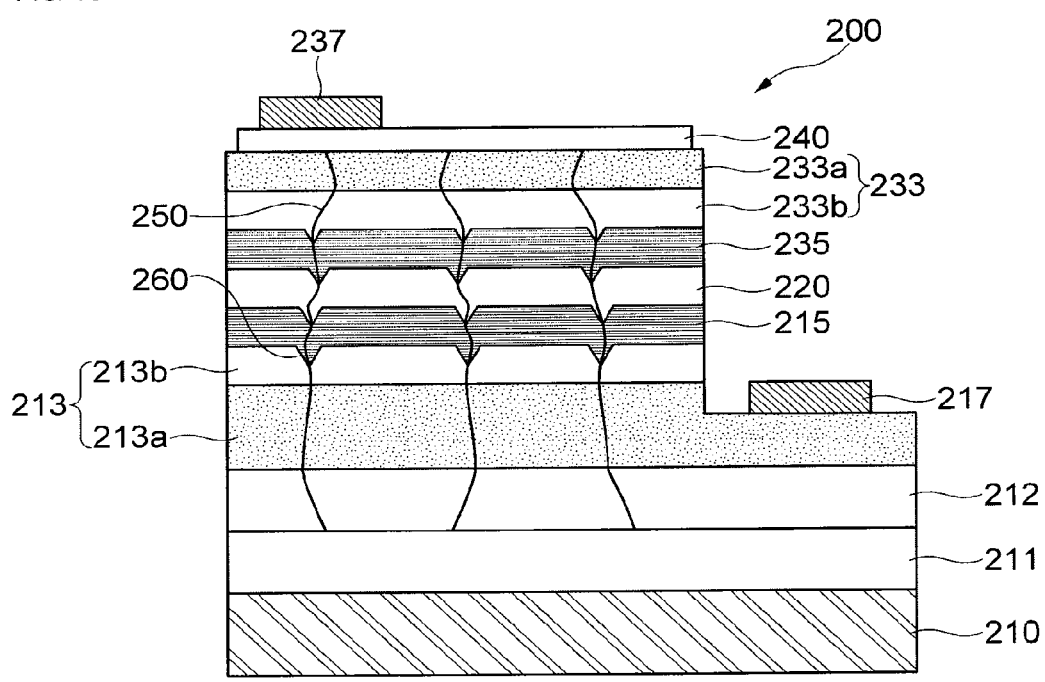

FIG. 4A~FIG. 4C are cross sectional views for illustrating the fabrication method of the nitride semiconductor light emitting device in accordance with the present invention.

At first, as shown in FIG. 4A, after a substrate 210 is prepared, a buffer layer 211 is formed on the substrate 210.

The substrate 210, as described above, is formed by using a transparent material preferably including sapphire as a substrate suitable for growing a nitride semiconductor single crystal and it can be formed by using a material such as zinc oxide (ZnO), gallium nitride (GaN), gallium arsenide (GaAs), silicon, silicon carbide (SiC), aluminum nitride (AlN) or the like in place of the sapphire. And also, at leas one unevenness can be used on a surface of the substrate. A shape of the unevenness can be various shapes such as a circle, a triangle, a pentagon, a hexagon and an octagon and also the cross sectional shape of the unevenness can employ a substrate surface structure of various shape such as a circle (an oval), a triangle and a rectangle to thereby improve the brightness of the light emitting device and reduce the crystal defects.

The buffer layer 211 can be formed with a conventional nitride based semiconductor, e.g., GaN, AlN or the like, as a layer for improving the lattice matching with the substrate 210 formed by including the sapphire before growing the n-type nitride semiconductor layer.

If the nitride based semiconductor material is used as a buffer, the formation temperature, i.e., growth temperature, of the nitride based semiconductor material is ranged from 200° C. to 900° C., whereas if the carbide based material is used as a buffer, the formation temperature, i.e., growth temperature, of the carbide based material can be controlled with a range from 500° C. to 1500° C. However, the buffer layer 211 can be omitted according to the type and the growth method of the substrate 210.

Thereafter, an un-doped GaN layer 212 is grown on the buffer layer 211 within a range from 0.01 μm to several μm under the state that the n-type impurities are not doped and an n-type GaN contact layer 213a doped with n-type impurities such as Si, Ge, Sn or the like on a top of the un-doped GaN layer 212 is formed.

At this time, it is preferable that the concentration of the n-type impurities is above $3 \times 10^{18}/cm^3$, and an effect of reducing a threshold voltage (Vf) can be obtained at a range which does not deteriorate crystal property as increasing the concentration of the n-type impurities. However, if the concentration of the n-type impurities becomes excessive to $5 \times 10^{21}/cm^3$, since the crystal property is deteriorated, it is preferable that the concentration of the n-type impurities is determined within a range from $3 \times 10^{18}/cm^3$ to $5 \times 10^{21}/cm^3$ not to deteriorate the crystal property.

Sequentially, an n-type GaN layer 213b having the V-shaped distortion structure is formed on the n-type GaN contact layer 213a. A method for forming the V-shaped distortion structure 260 is obtained by using a method of controlling a growth temperature and a method of chemical etching.

The method of controlling the growth temperature can form the V-shaped distortion structure 260 on the GaN layer 213b as a method for growing the n-type or un-doped GaN by a temperature ranging from 700° C. to 950° C. under atmosphere of nitrogen as a carrier gas.

Figure 5A:
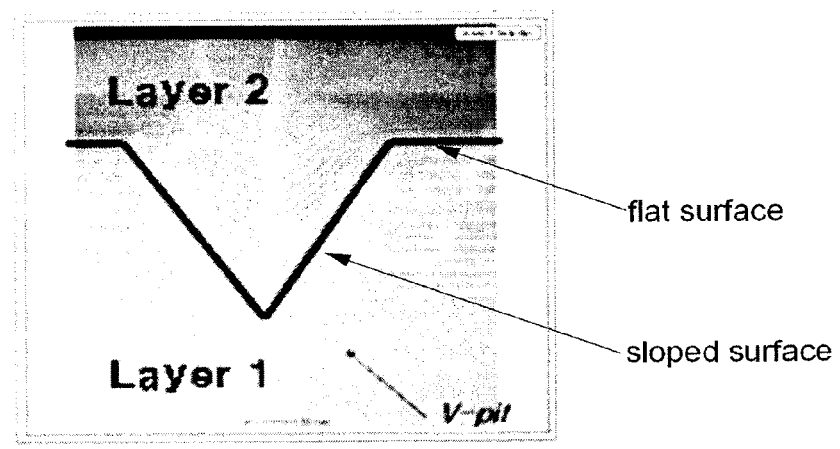
FIGS. 5A and 5B are photographs taken by a microscope to show the V-shaped distortion structure on the n-type GaN layer obtained through a control of growth temperature.
Figure 5B:
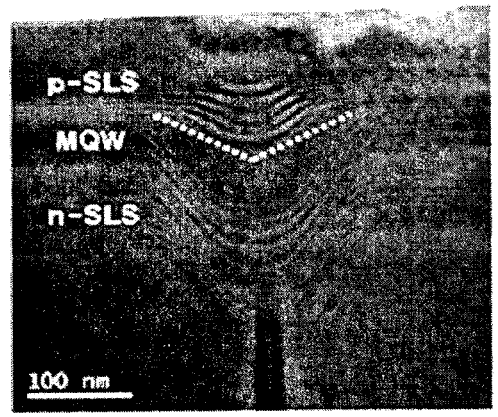

FIG. 5A and FIG. 5B are photographs taken by a microscope for showing the V-shaped distortion structures of the p-type layer/active layer/n-type layer GaN based light emitting device on the n-type GaN layer 213b; and, as shown in the drawings, the V-shaped layer structure representing the shape of a surface including a normal growth surface (0001) together with a sloped growth surface (1–101) can be detected.

The method of chemical etching can form a similar V-shaped layer structure by chemically etching the surface of the n-type GaN layer 213b using a phosphoric acid after picking out the substrate formed to the n-type GaN layer 213b from a reactor.

And also, the V-shaped layer structure generally exists at a region where the threading dislocations are formed, although the threading dislocations still exist through the semiconductor layers to be formed at the following steps, almost all the threading dislocations stop in the middle of the layers (referring to FIG. 5B).

In general, in the light emitting device with longitudinal and vertical sizes above several hundreds micrometers, the number of the V-shaped distortions (defects) is larger than one and are generated equal to or less than the distribution of dislocations 250 to be penetrated. For example, if the number of the dislocations 250 is $5 \times 10^8/cm^3$, the dislocations 250, i.e., defects, of the V-shape exist below the number of to $5 \times 10^8/cm^3$; it is most ideal that the dislocations and the V-shaped distortions have the same distribution and the same number by forming the V-shaped distortions all the dislocations; and therefore, in the structure of the present invention, the V-shaped distortions are formed almost all the dislocations.

As described above, after the n-type GaN layer 213b having the V-shaped distortion structure 260 is formed, as shown in FIG. 4B, the n-type super lattice layer 215 is formed by repeatedly stacking at least three layers having different ingredient made of AlxInyGazN ($0 \leq x, y, z \leq 1$) on the n-type GaN layer 213b.

And, an active layer 220 including at least one quantum well structure is formed on a top of the n-type super lattice layer 215 by alternately stacking the AlxInyGazN/AlxInyGazN ($0 \leq x, y, z \leq 1$). At this time, a wavelength or quantum efficiency can be controlled by adjusting the height of barriers of the quantum well, the thickness of the well layer, ingredient and the number of the quantum wells in the active layer 220.

Meanwhile, the growth temperature of the n-type super lattice layer 215 and the active layer 220 is performed below 900° C., therefore, the V-shaped distortion structure formed on the n-type GaN layer 213b can be maintained.

Thereafter, a p-type super lattice layer 235 is formed on the active layer 220 by repeatedly stacking at least three layers having different ingredient made of AlxInyGazN ($0 \leq x, y, z \leq 1$) which is doped or partially un-doped with the p-type impurities. Representatively, the p-type super lattice layer 235 can be formed by sequentially repeating the AlGaN/GaN/InGaN.

The p-type impurities can be Mg, Zn, Be or the like and the Mg can be used as a representative material among these.

In the next step, the p-type GaN layer 233b is formed on the p-type super lattice layer 235, after the p-type GaN contact layer 233a is formed on the p-type GaN layer 233b by increasing the doping concentration of the p-type impurities higher than that of the p-type GaN layer 233b, a transparent electrode 240 is formed on the p-type GaN contact layer 233a by depositing a transparent conductive material such as ITO (Indium-Tin Oxide) or IZO (Indium-Zinc Oxide).

Since the thickness of the p-type GaN layer 233b has an effect on a forward direction ESD characteristic, if the thickness of the p-type GaN based material layer is above 250 nm on the active layer, the forward ESD value achieves the tolerance value having higher than 6 Kv.

On the other hands, the p-type super lattice layer 235, the p-type GaN layer 233b and the p-type GaN contact layer 233a are grown above 100° C. and in the growth temperature a surface of the p-type GaN contact layer 233a becomes flat by filling the valley of the V-shape.

Sequentially, as shown in FIG. 4C, a partial region of the n-type GaN contact layer 213a is exposed by mesa etching the transparent electrode 240, the p-type GaN contact layer 233a, the p-type GaN layer 233b, the p-type super lattice layer 235, the active layer 220, the n-type GaN layer 213b and the n-type GaN contact layer 213a.

And then, the nitride semiconductor light emitting device in accordance with the present invention can be manufactured by forming an n-type electrode 217 on the exposed n-type GaN contact layer 213a and forming a p-type electrode 237 on the transparent electrode 240.

A vertical type device can be also manufactured by forming electrodes on a top side of the p-type and a bottom side of the n-type after removing a substrate for growing in the manufacturing processes of the light emitting device.

And also, light extraction efficiency can be improved by forming at least one unevenness structure on at least one side of the p-type or n-type semiconductor or the exposed surface of the light emitting device.

In accordance with the present invention, the semiconductor layer can be formed through the MOCVD method, and also previously known various methods such as MBE method can be used.

The nitride semiconductor light emitting device of the present invention manufactured through the above-described method can improve the ESD efficiency by artificially forming the V-shaped distortion structures on the portion where the threading dislocations are positioned at least one region among the n-type nitride semiconductor layer, the active layer or the p-type nitride semiconductor layer.

The basic concept of the present invention is that the V-shaped distortion structures are formed around the threading dislocations to prevent a phenomenon of concentrating the current on the regions during the apply of static electricity to thereby prevent the light emitting device from being damaged, and the V-shaped distortion structures can be formed in every layer inside of the light emitting structure if there exist the threading dislocations.

In addition, except for the structure of the light emitting device exemplified at the embodiments of the present invention, if the leakage currents can be prevented by forming the V-shaped distortion structures around the threading dislocations, the structure can includes any known structures.

As described above, the nitride semiconductor light emitting device in accordance with the present invention prevents the device from being broken according to the application of static electricity by forming the V-shaped distortion structure around the threading dislocations generated from the lattice mismatching, thereby further improving the property and life span of the device.

As described above, although the preferable embodiment of the present invention has been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A semiconductor light emitting device comprising:
   an n-type semiconductor layer;
   an active layer formed on the n-type semiconductor layer;
   a p-type semiconductor layer formed on the active layer, the p-type semiconductor layer comprising a p-type cladding layer formed on the active layer and a p-type contact layer formed on the p-type cladding layer;
   an n-type electrode formed on the n-type semiconductor layer; and
   a p-type electrode formed on the p-type semiconductor layer,
   wherein a V-shaped distortion structure is formed at the n-type semiconductor layer and the active layer and the p-type semiconductor layer,
   at least one of the n-type semiconductor layer and the p-type semiconductor layer further includes a super lattice layer or a multi-stacked layer,
   the V-shaped distortion structure is filled in an area between the p-type contact layer and the active layer, so that the lower surface of the p-type contact layer is flat, and
   the upper and lower surfaces of the active layer in the V-shaped distortion are bended toward the n-type semiconductor layer, respectively.

2. The semiconductor light emitting device according to claim 1, further including an unevenness structure at an exposed surface of at least one side of the n-type a semiconductor layer and the p-type semiconductor layer.

3. The semiconductor light emitting device according to claim 1, wherein the V-shaped distortion structure includes a flat surface together with a sloped surface.

4. The semiconductor light emitting device according to claim 1, wherein the V-shaped distortion structure becomes smooth in shape, i.e., a valley shape, as approaching the active layer and the p-type semiconductor layer.

5. The semiconductor light emitting device according to claim 4, wherein a surface of the p-type semiconductor layer is flat.

6. The semiconductor light emitting device according to claim 1, wherein the n-type semiconductor layer includes:
   an n-type GaN based semiconductor layer; and
   an n-type super lattice layer or a multi-stacked layer.

7. The semiconductor light emitting device according to claim 6, wherein the n-type super lattice layer is formed with a repeated structure of three layers, each of the three layers is made of an AlGaN layer, a GaN layer, and an InGaN layer, and at least one layer of the three layers has a thickness below 20 nm.

8. The semiconductor light emitting device according to claim 1, wherein the p-type semiconductor layer includes:
   a p-type super lattice layer or a multi-stacked layer; and
   a p-type GaN based semiconductor layer.

9. The semiconductor light emitting device according to claim 7, wherein the p-type super lattice layer is formed with a repeated structure of three layers, each of the three layers is made of an AlGaN layer, a GaN layer, and an InGaN layer, and at least one layer of the three layers has a thickness below 20 nm.

10. The semiconductor light emitting device according to claim 1, further comprises a substrate formed on the lower surface of the n-type semiconductor layer.

11. The semiconductor light emitting device according to claim 10, wherein the substrate is made of a material selected from a group consisting of sapphire, spinel ($MgAl_2O_4$), SiC, Si, ZnO, GaAs and GaN.

12. The semiconductor light emitting device according to claim 10, wherein the substrate includes at least one unevenness structure on a surface thereof.

13. The semiconductor light emitting device according to claim 1, further including an unevenness structure at an exposed surface of at least one side of an n-type or a p-type semiconductor.

14. The semiconductor light emitting device according to claim 1, wherein the super lattice layer is formed with a repeated structure of at least three layers, each of the layers is made of $Al_xIn_yGa_zN$ ($0 \leq x, y, z \leq 1$) with a different composition.

* * * * *